United States Patent [19]

Mishra et al.

[11] Patent Number: 5,795,798
[45] Date of Patent: Aug. 18, 1998

[54] METHOD OF MAKING FULL COLOR MONOLITHIC GAN BASED LEDS

[75] Inventors: Umesh Kumar Mishra; Steven P. DenBaars; David Joseph Kapolnek, all of Santa Barbara, Calif.

[73] Assignee: The Regents of the University of California, Oakland, Calif.

[21] Appl. No.: 758,581

[22] Filed: Nov. 27, 1996

[51] Int. Cl.⁶ .................................................. H01L 21/00
[52] U.S. Cl. .................................................. 438/35; 438/44
[58] Field of Search .................................. 437/127; 438/35, 438/44

[56] References Cited

U.S. PATENT DOCUMENTS 3,864,592  2/1975  Pankove ............................... 313/503

Primary Examiner—Brian Dutton
Attorney, Agent, or Firm—Merchant, Gould, Smith, Edell, Welter & Schmidt

[57] ABSTRACT

A method and apparatus for producing full-color luminescent monolithic semiconductor devices. Each portion of the device is bandgap engineered by using different dopants to change the direct bandgap of selected areas of each region, thereby allowing that region to produce different wavelengths of emitted light at high efficiencies.

4 Claims, 2 Drawing Sheets

METHOD OF MAKING FULL COLOR MONOLITHIC GAN BASED LEDS

CROSS-REFERENCE TO RELATED APPLICATION

This application is related to U.S. patent application Ser. No. 08/707,056 filed Sep. 3, 1996, entitled "Selective Area Epitaxy of Gallium Nitride." (Attorney Docket No. 30794.11US01.)

BACKGROUND OF THE INVENTION

1. Field of the Invention

A low power white or full visible spectrum light source is a valuable electronic device. This invention relates in general to a method for creating optoelectronic devices, and more particularly to a method for creating optoelectronic devices that can produce the full visible spectrum of light.

2. Description of Related Art

In the field of electronics, new materials are being used to perform previously unobtainable goals, e.g., new devices, smaller devices, and more efficient devices. The ability to grow or otherwise manufacture these new materials has been limited by the understanding of the chemistry that is occurring, the need for the finished devices, and the ability to mass produce such devices.

The devices result from different areas of study. The first area is the ability to actually grow the material onto a substrate. Several different types of growth techniques have been approached for various materials. The second area is the ability to process those materials once they are grown onto a substrate. Many materials that are now in their infancy take their growth and processing techniques from more established materials, e.g., silicon, gallium arsenide, and others.

The Group III (Al, Ga, In) nitrides are materials that are producing devices previously unavailable in the electronics market. For example, Gallium Nitride (GaN), when grown on a sapphire substrate produces illumination in the blue region (400 nm). These "blue diodes" cannot be made with any other materials currently known. A further development of materials, such as aluminum gallium nitride (AlGaN) produces ultraviolet light (200 nm).

These advances in the ability of a material to produce luminescence in those optical regions allow for the use of the electronics to take the place of typical lighting fixtures. Further, the use of blue and UV diodes in the recording industry for the recording of CD-ROMs instead of the red lasers (800 nm) currently being used in that industry allow for a up to four times higher density of information per unit distance on a CD-ROM track. Production of Light Emitting Diodes (LEDs) which use a lens shaped protective cover allow for high intensity light at low power levels. With the availability of blue diodes from the proper processing of Gallium Nitride, white light can now be produced. This white light source can now be used for lighting in environments where incandescent or fluorescent lights could not be used previously because of the robustness of the LEDs with respect to typical fluorescent and incandescent lighting fixtures. Further, since white light is a combination of the blue light from the blue diodes, green light from green diodes, and red light from red diodes, all other colors can be produced.

A two-flow technique is currently being used to grow Gallium Nitride onto sapphire wafers of approximately two inches in diameter. The reason that the two-flow technique is limited to a two-inch wafer is because the thermal expansion coefficient of Gallium Nitride is higher than that of sapphire, causing the sapphire wafer or any other substrate to crack and break if the growth area is too large. In addition, the two-flow technique suffers from prereaction of ammonia and trimethyl gallium when scaling up to multiple wafer reactors.

The two-flow technique for growth of Gallium Nitride does not allow efficient scale-up of the growth of good quality Gallium Nitride film on a wafer any larger than two inches. This inability to efficiently produce Gallium Nitride devices has kept the cost of Gallium Nitride devices high and their availability low.

Further, there are no devices that combine blue, red and green LEDs into a single portable unit. The low power requirements of LEDs make them naturally applicable to portable devices because then the devices will not have such stringent power storage requirements. Further, the use of LEDs, utilizing lower power than conventional light sources, that can produce white light, and therefore all colors of light, would reduce home and business power consumption.

The uses for Gallium Nitride devices are especially attractive in the low power region. Highly efficient devices are required for current applications that operate on battery power, since most portable electronics are constrained by the amount of available battery power that can be carried with the device.

It can seen then that there is a need for producing white light for a reduced cost. It can also be seen that there is a need for the ability to produce white light at a lower power consumption.

SUMMARY OF THE INVENTION

To minimize the limitations in the prior art described above, and to minimize other limitations that will become apparent upon reading and understanding the present specification, the present invention discloses a powerful and highly productive system and method for creating electronic devices that produce white light. The present invention is comprehensive and fully integrable with current processing techniques.

The present invention solves the above-described problems by providing a method for producing individual wavelength producing areas on a single substrate. The method allows for different illumination intensity from each LED by scaling the area of each area depending on the intensity expected to be produced by that region. The use of a single substrate to produce all three wavelengths required makes the finished device easier and cheaper to produce.

A method in accordance with the principles of the present invention comprises the steps of growing a nucleation layer on a sapphire substrate to separate the active regions from the substrate, growing an Si-doped n+GaN film on the nucleation layer to act as the anode layer of the individual devices, scaling the growth regions on the Si-doped n+GaN film to compensate for the intensity expected from each area, and growing variably doped layers of various GaN alloys to produce different wavelengths.

The present invention will produce a single electronic device that produces white light. The present invention will also produce the electronic device cheaply and efficiently. These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there is illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

Figure 1A:
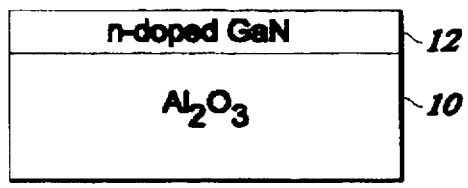
FIG. 1 is a block diagram depicting a device that embodies the invention.

In the following description of the preferred embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides a method and article of manufacture for producing white light from a monolithic device.

The selective area growth MOCVD technique shows promise in that the wafer has a pattern of "streets" predeposited on the wafer surface to allow for pre-stressing of the wafer prior to Gallium Nitride growth. Currently, silicon dioxide ($SiO_2$) is being used as the street material, however the $SiO_2$ begins to flow from the pattern layout into the areas where the Gallium Nitride is to be grown. Once this flow of $SiO_2$ occurs, any area of the wafer that is covered by $SiO_2$ will prevent Gallium Nitride growth, thereby destroying the shape of the pattern that the $SiO_2$ created on the wafer. The use of aluminum oxide, ($Al_2O_3$), should increase the ability for the street material to maintain its form during the Gallium Nitride growth process, because $Al_2O_3$ can withstand higher temperatures than $SiO_2$ can.

Selective area growth acts as an enabling feature for Gallium Nitride processing. The ability to now grow Gallium Nitride on a wafer larger than two inches increases the availability of Gallium Nitride devices. This increased availability should lower prices and allow for tailoring of the Gallium Nitride device characteristics. Further, selective area growth can be used for other materials that have high thermal coefficient of expansion differences between the material to be grown and the substrate on which the material will be grown. The street material is then removed from the wafer using an etching technique, providing easily defined dicing lines to break up the wafer into its individual integrated circuit components.

The merit of this device will be the generation of white light in a monolithic device based on selective area epitaxy and band gap engineering of GaN based semiconductor alloys. These LEDs will have enormous potential as white light sources as the estimate of energy efficiency is superior to tungsten light bulbs. Nitride based LEDs are distinguished by long lifetimes and low power consumption typical for solid state emitters, combines with the robustness of nitride semiconductors which are capable of operating under extreme thermal conditions in a harsh environment.

The approach for fabricating a full color LED utilizes the potential of the bandgap of the (Ga,In)N semiconductor alloy ranging for the ultraviolet to the red in the light spectrum. Table 1 summarizes important physical properties of the binary nitride semiconductors. The group-III nitrides combine the merit of direct bandgap materials with a high structural and thermal stability and thermal conductivity. The emission wavelength of the LED is determined by the composition of the GaInN and by the confinement of the active region. Thereby, GaInN quantum wells provide high radiative recombination efficiency due to the optical confinement and lower tendency of forming misfit related dislocations.

TABLE 1

Physical Properties of Binary Group-III Nitride Semiconductors

| | AlN | GaN | InN | SiC | GaAs |
|---|---|---|---|---|---|
| band gap 300 K $E_g$/eV | direct 6.2 | direct 3.39 | direct 1.89 | indirect 2.2 | direct 1.42 |
| band edge emission wavelength/nm | 199 | 365 | 656 | | |
| bond energy in tetrahedral crystal $\Delta_D H$/eV | 2.88 | 2.2 | 1.98 | | |
| thermal conductivity $\kappa$/W cm$^{-1}$ K$^{-1}$ | 2 | 1.3 | ... | 4.9 | 0.55 |

The key problem in manufacturing full color nitride LEDs is the growth of high optical quality GaInN films. The main obstacle for the growth of GaInN with high In contents is the low stability of the binary InN component. Therefore, GaInN films have to be grown at temperatures below 800° C. where the commonly employed nitrogen precursor ammonia ($NH_3$) shows low decomposition efficiency causing In droplet formation and poor optical and structural film quality.

For the growth of the GaInN active LED region, we propose the application of selective area epitaxy, described in related application Ser. No. 08/707,056. The use of selective area epitaxy takes advantage of the lateral material transport which causes different alloy compositions in the growth windows.

In selective area growth, the composition of semiconductor alloys depends on the geometry of the mask design. The vicinity of dielectric masks to unmasked semiconductor areas causes an increase of the growth rate and the In-content in regrowth windows. Furthermore, the indium incorporation efficiency was found to increase due to the catalysis of ammonia decomposition on the dielectric mask next to the growth window. Simultaneously, the vicinity of masked and unmasked regions prevents any growth on the dielectric mask.

FIGS. 1A through 1F are block diagrams depicting the method of the invention. In FIG. 1A, a substrate 10 is shown with a layer 12 grown on top. The substrate 10 can be sapphire, ($Al_2O_3$) or any other material. The layer 12 is typically Gallium Nitride (GaN), or doped GaN. GaN can be doped as p-type or n-type.

Figure 1B:
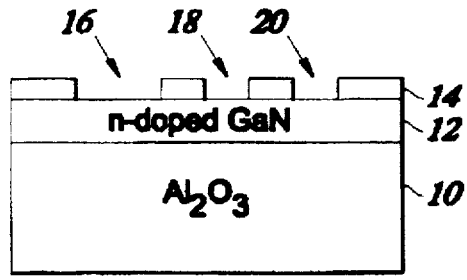

FIG. 1B shows the substrate 10 with layer 12 and an additional mask layer 14 grown on top of the layer 12. The mask layer 14 is typically silicon dioxide or aluminum oxide, but can be any material that can be easily deposited or removed from the layer 12. The mask layer 14 defines first opening 16, second opening 18, and third opening 20 such that areas of the layer 12 are alternatively exposed and covered by the mask layer 14. The first opening 16, second opening 18, and third opening 20 can be square as shown, or can be of some other shape. The sizes of first opening 16, second opening 18, and third opening 20 are determined by the expected dopant density of the materials to be deposited within the respective openings.

Figure 1C:
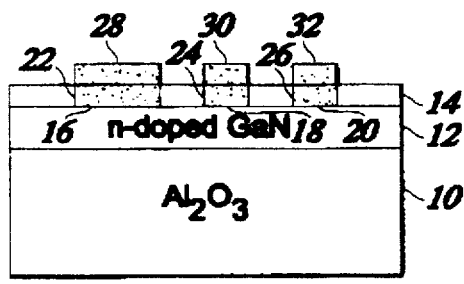

FIG. 1C shows a side view of the substrate 10 with the first opening 16 filled with first material 22, second opening 18 filled with second material 24, and third opening 20 filled with third material 26. Mask layer 14 prevents the growth of any of the first material 22, second material 24, and third material 26 from growing anywhere on the mask layer 14. Further, the growth of first material 22, second material 24, and third material 26 can be stopped at any time, and a fourth material 28, fifth material 30, and sixth material 32 can be grown. Multiple layers of materials within first opening 16, second opening 18, and third opening 20 can be grown. First material 22 is typically InGaN, but can be another material. Second material 24 and third material 26 are typically AlGaN, but can be other materials. Fourth material 28 is typically p-type GaN, but can be another material. Fifth material 30 and sixth material 32 are typically AlGaN, but can be other materials.

Figure 1D:
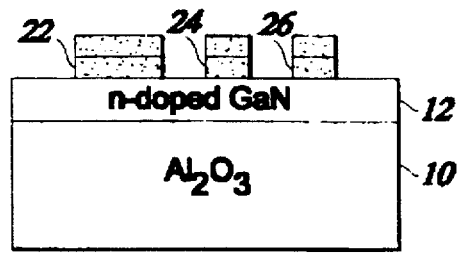
Figure 1E:
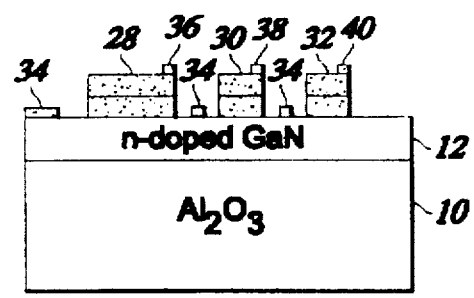

FIG. 1D shows the structure with mask layer 14 removed from the substrate. FIG. 1E shows common contacts 34 deposited on layer 12. Common contacts 34 are typically titanium or aluminum, but can be other materials that ohmically contact with layer 12. First contact 36 is deposited on fourth material 28. Second contact 38 is deposited on fifth material 30. Third contact 40 is deposited on sixth material 32. First contact 36, second contact 38, and third contact 40 are typically gold or nickel, but can be other materials that ohmically contact with fourth material 28, fifth material 30, and sixth material 32.

Figure 1F:
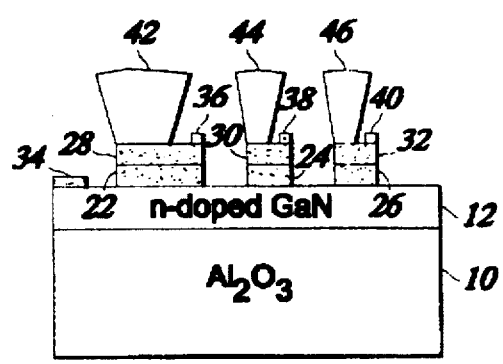

FIG. 1F shows the projection of light from the structure. The application of voltage between common contact 34 and first contact 36 causes emission of first light 42 from the combination of first material 22 and fourth material 28. Similarly, the application of voltage between common contact 34 and second contact 38 causes emission of second light 44 from the combination of second material 24 and fifth material 30, and the application of voltage between common contact 34 and third contact 40 causes emission of third light 46 from the combination of third material 26 and sixth material 32.

First light 42 is typically blueish in color. Second light 44 is typically green in color. Third light 46 is typically red in color. When first light 42, second light 44 and third light 46 are combined, the resultant combination is white light. By controlling the relative brightness of first light 42, second light 44 and third light 46, the combination can produce any color of light desired.

Figure 2:
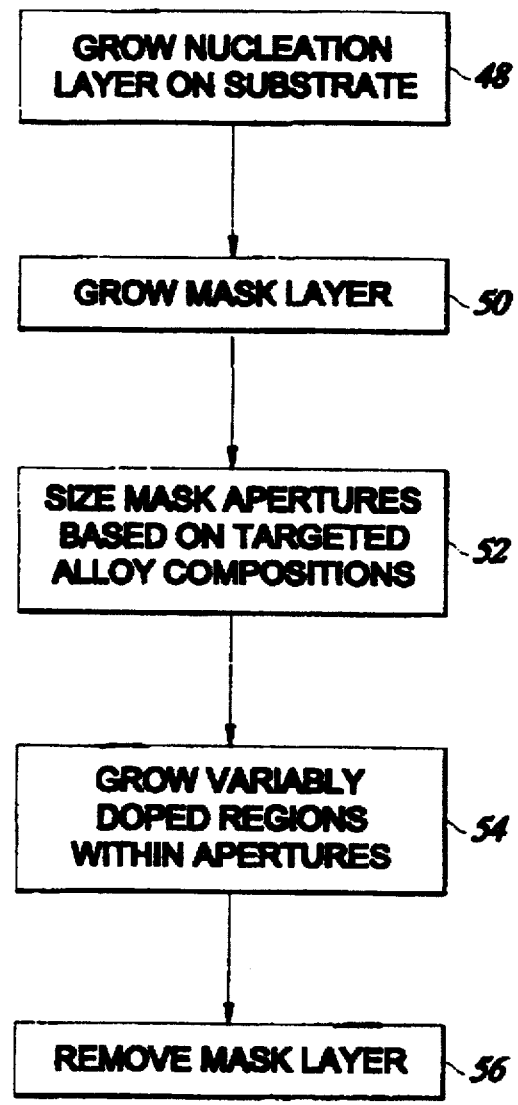
FIG. 2 is a flow chart describing the steps of employing the present invention.

FIG. 2 is a flow chart describing the steps of employing the present invention.

Block 48 shows the step of growing the nucleation layer on the substrate. Block 50 shows the step of growing the mask layer. Block 52 shows the step of sizing the apertures in the mask layer based on the expected or targeted alloy compositions. Block 54 shows the step of growing the variably doped regions within the apertures. Block 56 shows the step of removing the mask layer.

In general, the present invention provides a method for producing white light from an electronic device. Further, the invention provides a method of producing the white light producing device monolithically, i.e., on a single wafer. The production of regions that produce different wavelengths of light on a single wafer has not been performed in the prior art. This method of electronic device production is easier to package and produce than current methods.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method of producing a white light source, comprising the steps of:

growing a nucleation layer on a substrate;

depositing a mask on the nucleation layer, the mask containing apertures;

depositing at least one conductive doped layer within the apertures of the mask; and removing the mask.

2. The method of claim 1, wherein the substrate is sapphire.

3. The method of claim 1, wherein the apertures are scaled based on a targeted alloy composition of the doped layer.

4. The method of claim 1, wherein the doped layer contains a first dopant within a first aperture of the mask and a second dopant within a second aperture of the mask.

* * * * *

UNITED STATES PATENT AND TRADEMARK OFFICE
CERTIFICATE OF CORRECTION

PATENT NO.   : 5,795,798                                                Page 1 of 1
DATED        : August 18, 1998
INVENTOR(S)  : Umesh Mishra, Steven DenBaars and David Kapolnek It is certified that error appears in the above-identified patent and that said Letters Patent is hereby corrected as shown below:

<u>Column 1,</u>
Line 10, before "BACKGROUND OF THE INVENTION" insert the following section:

-- STATEMENT AS TO RIGHTS TO INVENTIONS MADE UNDER FEDERALLY SPONSORED RESEARCH OF DEVELOPMENT

This invention was made with Government support under Grant Nos. N00014-97-C-0203 and N00014-96-C-0252, awarded by the Office of Naval Research. The Government has certain rights in this invention. --

Signed and Sealed this

Third Day of June, 2003

JAMES E. ROGAN
*Director of the United States Patent and Trademark Office*